United States Patent
Iyad Al Dibs

(10) Patent No.: US 10,118,818 B2
(45) Date of Patent: Nov. 6, 2018

(54) CONTROLLER FOR ACTUATING A MICROMECHANICAL ACTUATOR, ACTUATING SYSTEM FOR ACTUATING A MICROMECHANICAL ACTUATOR, MICRO-MIRROR SYSTEM AND METHOD FOR ACTUATING A MICROMECHANICAL ACTUATOR

(71) Applicant: Robert Bosch GmbH, Stuttgart (DE)

(72) Inventor: Mohamad Iyad Al Dibs, Pliezhausen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 599 days.

(21) Appl. No.: 14/471,809

(22) Filed: Aug. 28, 2014

(65) Prior Publication Data

US 2015/0066161 A1    Mar. 5, 2015

(30) Foreign Application Priority Data

Aug. 28, 2013  (DE) .................. 10 2013 217 102

(51) Int. Cl.
   *G05B 11/01*   (2006.01)
   *B81B 7/00*    (2006.01)

(52) U.S. Cl.
   CPC ........ B81B 7/008 (2013.01); *B81B 2201/042* (2013.01); *B81B 2207/03* (2013.01)

(58) Field of Classification Search
   CPC .......... G05B 19/41835; G02B 6/12002; G02B 26/085; G02B 27/0093; G02F 2/02; H03H 11/1295; H03H 11/1213; G01P 9/04; B81C 99/005; H01L 41/042; B81B 2201/042; B81B 2207/03; B81B 7/008
   See application file for complete search history.

(56) References Cited

U.S. PATENT DOCUMENTS

| | | | |
|---|---|---|---|
| 3,517,223 A * | 6/1970 | Gaunt, Jr. .......... | H03H 11/1213 327/232 |
| 3,566,284 A * | 2/1971 | Thelen ............... | H03H 11/1295 327/233 |

(Continued)

*Primary Examiner* — Tuan A Vu
(74) *Attorney, Agent, or Firm* — Norton Rose Fulbright US LLP; Gerard Messina

(57) ABSTRACT

A controller for a micromechanical actuator, and corresponding actuating system, micro-mirror system and method, including a first input for a reference signal, a second input for a measuring signal denoting a recorded response to a control signal, a first controller element to filter/attenuate predefined frequency modes and/or predefined frequency components in the received reference signal and to output a filtered/attenuated reference signal, a second controller element to modify the received measuring signal to minimize the quality of the first/further modes by processing the received measuring signal and to output a modified measuring signal, a third controller element to minimize deviation between the filtered/attenuated reference and received measuring signals and to output a minimized reference signal, a fourth controller element to rotate the phase of the difference between the minimized reference and modified measuring signals for at least one predefined frequency and to transmit the modified reference as the control signal.

12 Claims, 7 Drawing Sheets

(56) References Cited

U.S. PATENT DOCUMENTS

| | | | |
|---|---|---|---|
| 7,952,783 B2 | 5/2011 | Holmes et al. | |
| 2004/0264977 A1* | 12/2004 | Yap | G02F 2/02 |
| | | | 398/161 |
| 2008/0302187 A1* | 12/2008 | Huber | B81C 99/005 |
| | | | 73/597 |
| 2010/0149073 A1* | 6/2010 | Chaum | G02B 27/0093 |
| | | | 345/8 |
| 2010/0158429 A1* | 6/2010 | Popovic | G02B 6/12002 |
| | | | 385/3 |
| 2010/0312365 A1* | 12/2010 | Levin | G05B 19/41835 |
| | | | 700/37 |
| 2013/0120819 A1* | 5/2013 | Rothaar | G02B 26/085 |
| | | | 359/224.1 |
| 2013/0263665 A1* | 10/2013 | Opris | G01P 9/04 |
| | | | 73/504.12 |
| 2013/0264909 A1* | 10/2013 | Glaser | H01L 41/042 |
| | | | 310/317 |

* cited by examiner

CONTROLLER FOR ACTUATING A MICROMECHANICAL ACTUATOR, ACTUATING SYSTEM FOR ACTUATING A MICROMECHANICAL ACTUATOR, MICRO-MIRROR SYSTEM AND METHOD FOR ACTUATING A MICROMECHANICAL ACTUATOR

RELATED APPLICATION INFORMATION

The present application claims priority to and the benefit of German patent application no. 10 2013 217 102.1, which was filed in Germany on Aug. 28, 2013, the disclosure of which is incorporated herein by reference.

FIELD OF THE INVENTION

The present invention relates to a controller for actuating a micromechanical actuator, to an actuating system for actuating a micromechanical actuator, to a micro-mirror system and to a method for actuating a micromechanical actuator.

BACKGROUND INFORMATION

Micromechanical actuators are used in a plurality of applications today. For example, micro-mirrors are utilized in projector units which are to be set up in a very small installation space.

In such projector units, micro-mirrors are usually utilized which represent a so-called MEMS, i.e., micro electro mechanical system. These types of MEMS mirrors often have several mechanical resonance points which may be correspondingly electrically excited and which are also known as modes or poles in the transfer function. Furthermore, such MEMS mirrors also have anti-resonance modes which are also known as zero points in the transfer function or notch.

The modes of the MEMS mirrors are subdivided into useful modes and spurious modes. In particular, the excitation of spurious modes has a negative impact on the quality of the image projected.

The mentioned MEMS mirrors form a so-called inert spring mass system which in a first approximation may be modeled as a second order low pass (PT2 element.) In this configuration, the cutoff frequencies of the inert spring mass system are defined by its first mode.

This type of MEMS mirror may either be operated resonantly on either one or multiple useful modes or may be operated quasi-statically. The quasi-static actuation takes place with the aid of a low-frequency signal and avoids excitation of the modes.

FIG. 9 shows the transfer functions for different MEMS micro-mirrors in a Bode plot. The upper diagram shows the attenuation in dB over the frequency. The lower diagram shows the phase in degrees over the frequency. It is apparent in the upper diagram that the five micro-mirrors, of which the transfer functions are shown, exhibit a plurality of resonance modes and anti-resonance modes. These are shown in the diagram with spikes which spike upward or downward. Furthermore, it is apparent in the lower diagram that the mirrors exhibit different phase responses as a function of the frequency. In particular, several mirrors exhibit a phase response which is, at least up to a certain frequency, between −0° and −180°, while in other mirrors the phase response exceeds beyond −180°.

Usually, two MEMS mirrors are required to construct the image with the aid of MEMS mirrors, one of the MEMS mirrors being actuated resonantly and one of the MEMS mirrors being operated quasi-statically. The MEMS mirror which is being operated resonantly is in charge of the line projection of the images, and the MEMS mirror which is being operated quasi-statically is in charge of the line-by-line image construction. Another possibility is using a 2D mirror which is operated both in a vertical and in a horizontal direction.

The MEMS mirror which is being operated in the quasi-statical mode must be actuated in such a way that the resonance modes of the micro-mirror are not excited.

Usually, an MEMS mirror in quasi-statical mode is actuated using a sawtooth signal as a reference variable to, for example, generate a frame rate of 60 Hz. During this process, the sawtooth signal exhibits, in the frequency range, the multiples of the even and odd harmonics of the base frequency. The diagram in FIG. 10 shows two possible sawtooth signals having different return times as dashed and solid curves. The time is plotted on the x-axis, and the amplitude of the sawtooth signal is plotted on the y-axis. The rising edges in FIG. 10 are those edges which guide the MEMS mirror line by line.

The falling edges represent the return of the MEMS mirror into its initial position. The corresponding sawtooth signal in the frequency range is shown in FIG. 11.

FIG. 11 shows that the sawtooth signal exhibits frequency components at 60 Hz and the multiples of 60 Hz, i.e., 120 Hz, 180 Hz and so on, in the frequency range. When actuating an MEMS mirror using such a type of sawtooth signal, one of the multiples of the base frequency might excite a resonance mode of the respective MEMS mirror.

Usually, the MEMS mirrors in the quasi-static mode are actuated by using linear drivers or digital drivers. The micro-mirrors are controlled in a closed loop to achieve a sufficient accuracy during the actuation or to increase the linear deflection. During this process, different controllers may be used, for example, adaptive PD controllers, current controllers and position controllers in feed forward structure, LMS harmonic controllers, iterative harmonic coefficient determination, and the like. All controllers used have in common that they need a very large system bandwidth and thus require a very high amount of computing power.

Patent document U.S. Pat. No. 7,952,783 B2 discusses a controller working by using the iterative harmonic coefficient determination method.

For example, systems having MEMS mirrors and controllers usually require a controller bandwidth of 1 MHz to control every image line exactly. Furthermore, some of the known controller concepts require additional status information of the MEMS mirror which may actually only be determined with great difficulty or which is very difficult to estimate.

Large system bandwidth and high computing power mean a large space requirement in the IC control integrated circuits, for example, for analog-digital converters, microcontrollers, digital-analog converters, driver stages and the like.

SUMMARY OF THE INVENTION

The present invention provides a controller for actuating a micromechanical actuator having the features of claim 1, an actuating system for actuating a micromechanical actuator having the features of claim 7, a micro-mirror system having the features of claim 8 and a method including the features of claim 9.

The present invention provides for the following:

A controller for actuating a micromechanical actuator, including a first signal input which is configured to receive a reference signal, a second signal input which is configured to receive a measuring signal which denotes a recorded response by the micromechanical actuator to a control signal, a first controller element which is configured to filter and/or to attenuate predefined frequency modes and/or predefined frequency components in the received reference signal and to output a filtered and/or attenuated reference signal, a second controller element which is configured to modify the received measuring signal in order to minimize the quality of the first mode and/or further modes of the micromechanical actuator by processing the received measuring signal in the closed loop circuit and to output a modified measuring signal, a third controller element which is configured to minimize the deviation between the filtered and/or attenuated reference signal and the received measuring signal and to output the minimized reference signal, a fourth controller element which is configured to rotate the phase of the difference between the minimized reference signal and the modified measuring signal for at least one predefined frequency and to transmit the modified reference signal as the control signal to the micromechanical actuator.

Furthermore, it is provided:

An actuating system for actuating a micromechanical actuator including a signal generator which is configured to output a reference signal, a controller according to the present invention which is configured to receive the reference signal and to output a control signal for the micromechanical actuator, a first signal processing unit which is configured to process the control signal and to transmit it to the micromechanical actuator, and a second signal processing unit which is configured to record a response by the micromechanical actuator to the control signal and to transmit a measuring signal to a controller which denotes the recorded response.

Furthermore, it is provided:

A micro-mirror system including at least one micro-mirror and at least one actuating system according to the present invention which is configured to actuate the micro-mirror.

Finally, it is provided:

A method for actuating a micromechanical actuator including the steps of receiving a reference signal, receiving a measuring signal which denotes a recorded response by the micromechanical actuator to a control signal, filtering and/or attenuating predefined frequency modes and/or predefined frequency components in the reference signal, modifying the received measuring signal by minimizing the quality of the first mode and/or further modes of the micromechanical actuator by processing the received measuring signal in the closed loop circuit, minimizing the deviation between the filtered and/or attenuated reference signal and the received measuring signal and outputting a minimized reference signal, rotating the phase of the difference between the minimized reference signal and the modified measuring signal for at least one predefined frequency, and transmitting the difference between the minimized reference signal and the modified measuring signal with the rotated phase as the control signal to the micromechanical actuator.

The present invention is based on the finding that the controller structures of known controllers for actuating a micromechanical actuator are very complex and thus very costly in the implementation.

The present invention is now based on the idea of taking this finding into account and providing a modular multi-feedback controller structure according to the present invention which exhibits only four linear controller elements.

The present invention provides that a reference signal is processed by a first controller element which filters or attenuates predefined frequency modes and/or predefined frequency components in the received reference signal. The difference between the reference signal prepared in such a way and a measuring signal which denotes the instantaneous position of the micromechanical actuator is processed by a third controller element, which minimizes the deviation between the filtered and/or attenuated reference signal and the received measuring signal.

Finally, a fourth controller element rotates the phase of the difference between the minimized reference signal and a modified measuring signal, which is modified by a second controller element by minimizing the quality of the first mode or further modes of the micromechanical actuator by processing the received measuring signal in the closed loop circuit for at least one predefined frequency and transmits it to the micromechanical actuator as the control signal.

In particular, all controller elements of the present invention may be configured as linear controller elements.

The present controller structure minimizes, for example, the first resonance mode of the micro-mirror. Furthermore, a phase rotation is carried out in the controlled system, if the actuated micro-mirror exhibits a phase progression between −180° and −360° in its phase response. Finally all resonance modes of the micro-mirror outside the controller bandwidth are suppressed and a conventional controller is used to minimize the controller deviation.

The present invention provides a modular controller structure which as a function of the micromechanical actuator used may be adapted very simply to the individual application.

Furthermore, by using linear controller elements of a first to higher order, a very simple controller of little complexity is provided which may be very easily integrated, for example, into an ASIC.

The present invention enables the use of a controller having a small system bandwidth (10 times through 30 times of the first resonance mode of the micromechanical actuator), since no regulation of the individual image lines is necessary. The ability to adjust the individual controller elements furthermore enables a high controller quality.

Advantageous specific embodiments and refinements result from the subclaims as well as from the description with reference to the figures.

In one specific embodiment, the fourth controller element is configured to rotate the phase from −180° through −360° to 0° through −180°. This makes it possible for a system including a controller, a micro-mirror and the like to always be operated stably with sufficient bandwidth and a sufficient gain and phase reserve.

In one specific embodiment, the second controller element is configured to shift the complex poles of the first mode of the micromechanical actuator in the direction of the real axis of the pole-zero plot of the closed loop circuit. In this way, the quality of the first mode of the micromechanical actuator in the closed loop circuit is reduced or minimized and thus has no disadvantages for the image construction or the image projection.

In one specific embodiment, the second controller element is configured to, during modification, eliminate the first mode of the received measuring signal and to situate an additional pole with a predefined attenuation factor in the pole-zero plot of the received measuring signal. In this way, the quality of the first mode of the micromechanical actuator in the closed loop circuit is reduced or minimized and thus has no disadvantages for the image construction or the image projection.

In one specific embodiment, the third controller element is configured as a PID controller element. This enables a very easy implementation of the third controller element. Other specific embodiments of the third controller element are also possible.

In one specific embodiment, the first controller element is configured as a digital filter element, in particular as an IIR filter element and/or a notch filter element and/or an FIR filter element. This makes a very simple implementation with little complexity of the first controller element and a very flexible adaptability of the first controller element possible.

The above-mentioned embodiments and refinements may be arbitrarily combined with each other, if useful. Additional possible embodiments, refinements and implementations of the present invention also include not explicitly named combinations of features of the present invention, which were previously described or are described in the following with regard to the exemplary embodiments. Those skilled in the art will in particular also add individual aspects as improvements or supplements to the particular basic form of the present invention.

Thus, a controller is described for actuating a micromechanical actuator, including a first signal input to receive a reference signal, a second signal input to receive a measuring signal denoting a recorded response by the micromechanical actuator to a control signal, a first controller element to filter and/or to attenuate predefined frequency modes and/or predefined frequency components in the received reference signal and to output a filtered and/or attenuated reference signal, a second controller element to modify the received measuring signal to minimize the quality of the first mode and/or further modes of the micromechanical actuator by processing the received measuring signal and to output a modified measuring signal, a third controller element to minimize the deviation between the filtered and/or attenuated reference signal and the received measuring signal and to output a minimized reference signal, a fourth controller element to rotate the phase of the difference between the minimized reference signal and the modified measuring signal for at least one predefined frequency and to transmit the modified reference signal as the control signal to the micromechanical actuator. Also provided is a corresponding actuating system, micro-mirror system and method.

The present invention is elucidated below in greater detail with reference to the exemplary embodiments illustrated in the figures of the drawings.

DETAILED DESCRIPTION

Figure 1:
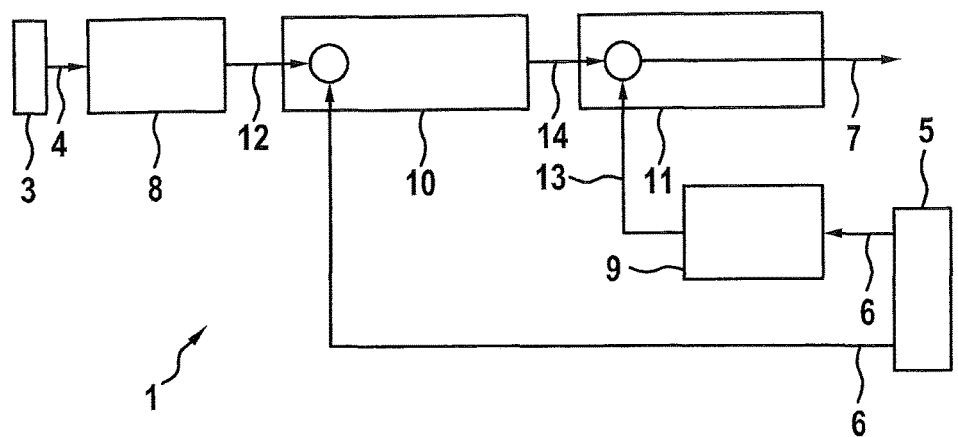
FIG. 1 shows a block diagram of one specific embodiment of a controller according to the present invention.

In all figures, identical or functionally equivalent elements and devices were denoted by the same reference numerals, unless indicated otherwise.

A micromechanical actuator is to be understood within the scope of this patent application as an actuator which is made of very small mechanical structures which may be actuated electrically. Such actuators are also known under the term MEMS (micro-electrical-mechanical-system).

A possible micromechanical actuator is, for example, a so-called micro-mirror. Micro-mirrors are, for example, used in video projectors to project the light of a light source line by line onto a screen.

To be able to use such a micro-mirror in a video projector it is necessary to control exactly the deflection of the micro-mirror. Knowledge of the transfer function of such a micro-mirror is required for an exact control. It may, for example, be the following:

$$G(s) = \frac{\left(\frac{1}{(2*pi*f02b)^2}*s^2 + 2*\frac{D02b}{2*pi*f02b}*s + 1\right)*ks02*ks01}{ks03*\left(\frac{1}{(2*pi*f01)^2}*s^2 + 2*\frac{D01}{2*pi*f01}*s + 1\right)*\left(\frac{1}{(2*pi*f_{02})^2}*s^2 + 2*\frac{D02}{2*pi*f_{02}}*s + 1\right)}$$

where:
D01: Attenuation factor of the first mode
D02: Attenuation factor of the second mode
D02b: Attenuation factor of the second anti-resonant mode
f01: Frequency of the first mode
f02: Frequency of the second mode
f02b: Frequency of the third mode
ks01: Component of mode 1 at the DC gain of the transfer function
ks02: Component of mode 2 at the DC gain of the transfer function
ks03: Component of mode 3 at the DC gain of the transfer function Reference signal is to be understood within the scope of this patent application as the signal which defines the desired position for the micromechanical actuator and which is supplied to the controller for the micromechanical actuator.

The measuring signal is the signal which represents the instantaneous position of the micromechanical actuator.

Modes, also called oscillation modes, refer to properties of standing waves with regard to their energy distribution. The modes occur, for example, usually in the resonance frequencies or the anti-resonance frequencies of the micromechanical actuator.

When within the scope of this patent application reference is made to a work step taking place in the pole-zero plot, the pole-zero plot of the micromechanical actuator or the MEMS element may be changed in the closed loop circuit. On the other hand it is also possible, for example, to achieve a shift of a zero point or pole in the pole-zero plot by applying the appropriate work step to a signal, for example, in the time range or frequency range, the work step directly changing the behavior of the micromechanical actuator so that the desired change is also apparent in the pole-zero plot of the closed loop circuit.

FIG. 1 shows a block diagram of one specific embodiment of a controller 1 according to the present invention.

Controller 1 exhibits a first signal input 3 which is coupled to a first controller element 8. First controller element 8 is coupled to a third controller element 10 which is coupled to a fourth controller element 11.

Furthermore, a second signal input 5 is provided, which transmits a received measuring signal 6 to a second controller element 9 and to a third controller element 10. Received measuring signal 6 denotes a recorded response by micromechanical actuator 2 to a control signal 7. Second controller element 9, which modifies received measuring signal 6 by minimizing or attenuating the quality of the first mode of the micromechanical actuator with received measuring signal 6 in the closed loop circuit, is connected downstream from second signal input 5.

First signal input 3 is configured to receive reference signal 4 and to transmit this signal to first controller element 8, which filters or attenuates predefined frequency modes and/or predefined frequency components out of received reference signal 4.

Third controller element 10 is the actual core of controller 1 and minimizes the deviation between filtered and/or attenuated reference signal 12 and received measuring signal 6. The third controller element outputs minimized reference signal 14 to fourth controller element 11.

Fourth controller element 11 rotates the phase of the difference between the minimized reference signal 14 and the modified measuring signal 13 for at least one predefined frequency or for a predefined frequency range. The rotated measuring signal 14 is transmitted to the micromechanical actuator 2 as the control signal 7.

First controller element 8 of controller 1 may be configured as a digital filter unit, for example, as an IIR filter, a notch filter or an FIR filter and is used to eliminate, attenuate or suppress undesirable frequency modes or frequency components in the reference variable of reference signal 4.

Second controller element 9 is able to minimize the quality of the first mode of the micromechanical actuator by processing received measuring signal 6. In one specific embodiment, second filter element 9 is able to shift the complex poles of the first mode of the micromechanical actuator in the closed loop circuit in the direction of the real axis of the pole-zero plot in the closed loop circuit by processing measuring signal 6. This corresponds to an increase in the attenuation. Furthermore, second controller element 9 is able to eliminate the poles of the first mode of the micromechanical actuator by processing measuring signal 6 and insert a new pole with an adapted attenuation factor, for example, 0.707, into the closed loop circuit.

In one specific embodiment the quality factor or the attenuation factor of the second or higher modes may be minimized by further feedback of one or multiple pieces of frequency information.

The transfer function of the MEMS element G(s) and fourth controller element 11 C1 (s) exhibits the following resulting transfer function Gtot1(s) in the closed loop circuit:

$$Gtot1(s) = G(s) * C1(s)$$

In this context, C1 (s) is a transfer function of at least the second order and exhibits an even order.

$$C1(s) = \frac{ks01 * \left( \frac{1}{(2*pi*f02b)^2} * s^2 + 2 * \frac{D02b}{(2*pi*f01b)^1} * s^1 + 1 \right)}{ks02b * \left( \frac{1}{(2*pi*f01)^2} * s^2 + 2 * \frac{D01}{(2*pi*f01)^1} * s^1 + 1 \right)}$$

where:
D01: Attenuation factor of the first mode
D02b: Attenuation factor of the second anti-resonant mode
f01: Frequency of the first mode
f02b: Frequency of the third mode
ks01: Mode 1 portion on the DC gain of the transfer function
ks02b: Mode 2 portion on the DC gain of the transfer function Fourth controller element 11 is used to invert or rotate the phase if the transfer function of the micromechanical actuator used exhibits two successive resonance modes which are followed by an anti-resonance mode.

Second controller element 9 exhibits a transfer function of at least the first order and may exhibit an even or an odd order.

For the closed loop circuit Gtot2(s) for second controller element 9 with H(s) and Gtot1(s), this results in the following transfer function:

$$Gtot2(s) = \frac{Gtot1(s)}{1 + H1(s) * Gtot1(s)}$$

In particular, the transfer function Gtot2(s) may be a function of at least the fifth order, which may, for example, exhibit an attenuation of $D0 = 0.1 \ldots 1/(2^\wedge - 1) \ldots 1$.

$$H(s) = \frac{k}{(1 + T * s)}$$

k: DC gain of the transfer function
T: The time constant of the transfer function This results in the following transfer function in one specific embodiment:

$$H(s) = \frac{G(s) * C1(s)}{(1 + H(s) * G(s) * C1(s))}$$

For third controller element 10, which may, for example, be a PID controller, this results in the following transfer function:

$$Gtot3(s) = \frac{Gtot2(s) * C2(s)}{1 + C2(s) * Gtot2(s)}$$

The transfer function C2(s) may be implemented as follows:

$$C(s) = K_R * \left(1 + T_D * s + \frac{1}{T_1 * s}\right)$$

Including first controller element 8, the following transfer function results for the entire system:

$$Gtot(s)=Gtot3(s)*F(s)$$

The transfer function F(s) may be configured as a digital FIR filter as F(z) as follows:

$$F(z) = \sum_{i=0}^{m} h(i) * z^i$$

m: Filter order

The transfer function F(s) may be configured as a digital IIR filter as F(z) as follows:

$$F(z) = \frac{(b_0 + b_1 * z^{-1} + b_2 * z^{-2} + \ldots + b_M * z^{-M})}{(a_0 + a_1 * z^{-1} + a_2 * z^{-2} + \ldots + a_N * z^{-N})}$$

N: Filter order

In one specific embodiment, controller 1 includes only blocks having linear functions each. Here, each linear function may be adapted individually to appropriate micromechanical actuator 2.

In particular, individual controller elements 8 through 11 or functions of individual controller elements 8 through 11 may be connected or disconnected as a function of appropriate micromechanical actuator 2.

The controller structure of controller 1 exhibits little complexity and may be easily implemented in both hardware, for example, in an ASIC, as well as in software, for example, in a DSP or in a processor.

Figure 2:
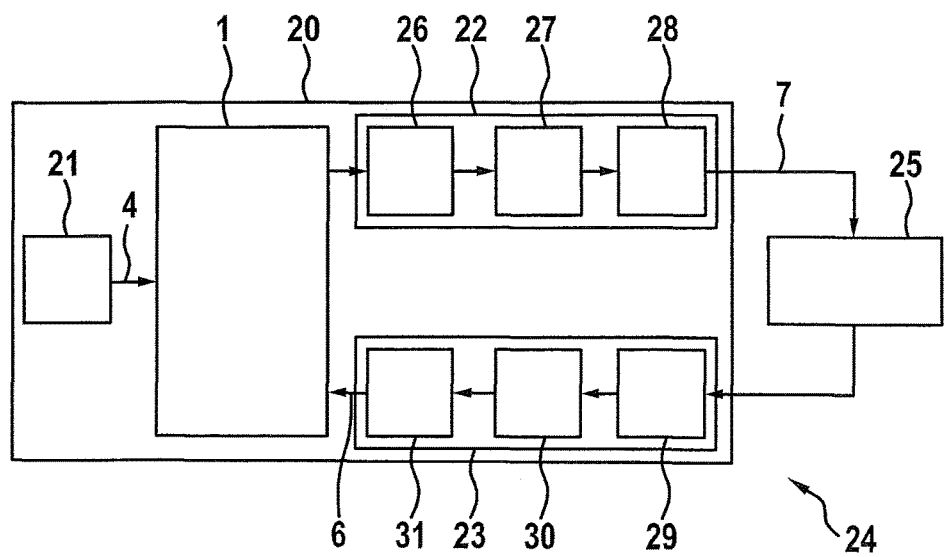
FIG. 2 shows a block diagram of one specific embodiment of an actuating system according to the present invention and a micro-mirror system according to the present invention.

FIG. 2 shows a block diagram of one specific embodiment of actuating system 20 according to the present invention and micro-mirror system 24 according to the present invention.

The transfer function of a micro-mirror 25 is dependent on the individual configuration of the actuator and the individual sensor.

Together, these represent the controlled system. All transfer functions of different micro-mirrors 25 have in common that micro-mirror 25 includes resonance modes and anti-resonance modes.

Figure 6:
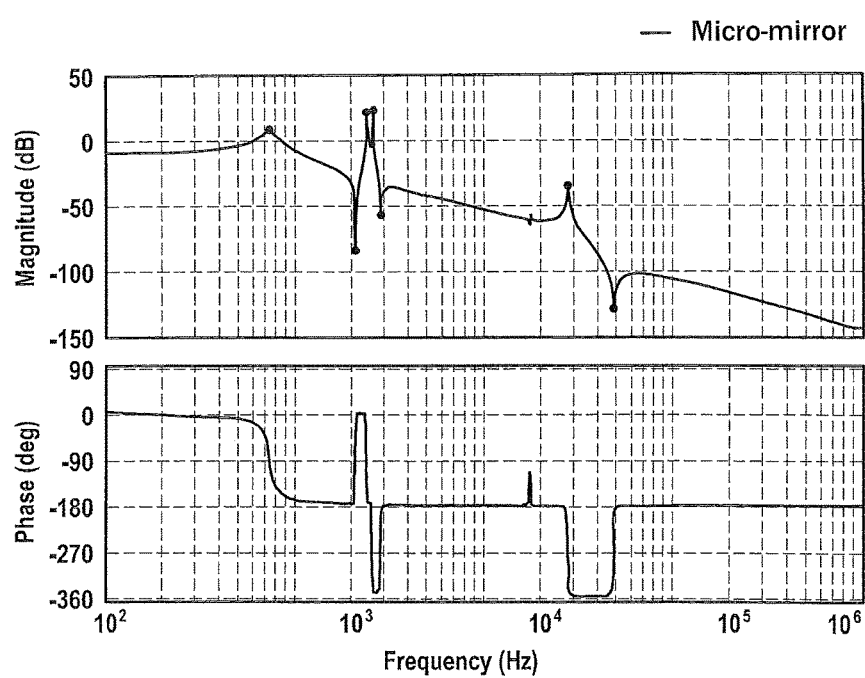
FIG. 6 shows a Bode plot of a micro-mirror.

The controllers for actuating micro-mirrors 25 attempt not to excite the resonance modes and, in this process, to excite or deflect micro-mirror 25 in a quasi-static mode with a frequency of approximately 60 Hz in order to be able to project stable image lines. In FIG. 6, a Bode plot for micro-mirror 25 is explained in greater detail.

In order to actuate one such controlled system of micro-mirror 25 and sensor, actuating system 20 provides signal generator 21, which generates reference signal 4 and outputs it to controller 1.

Controller 1 includes an output, via which the controller outputs a control signal 7 to a first signal processing unit 22 of actuating system 20. First signal processing unit 22 outputs control signal 7 in a processed form to micro-mirror 25.

First signal processing unit 22 in FIG. 2 includes a digital-analog converter 26 which converts control signal 7 of controller 1 into an analog control signal 7. Furthermore, signal processing unit 22 includes a low pass filter 27, which low-pass filters analog control signal 7. Finally, a driver stage 28 or a driver 28 is provided which adapts the filtered control signal in such a way that its level is suitable for actuating of micro-mirror 25.

Actuating system 20 furthermore includes a signal path via which the responses of micro-mirror 25 to control signal 7 are reverted to controller 1. For this purpose, actuating system 20 has a second signal processing unit 23.

At the input, second signal processing unit 23 includes an anti-aliasing filter 29, which outputs the filtered signal to an analog-digital converter 30. Finally, matching algorithms 31 may be provided, which continue to process the signal for controller 1.

Figure 3:
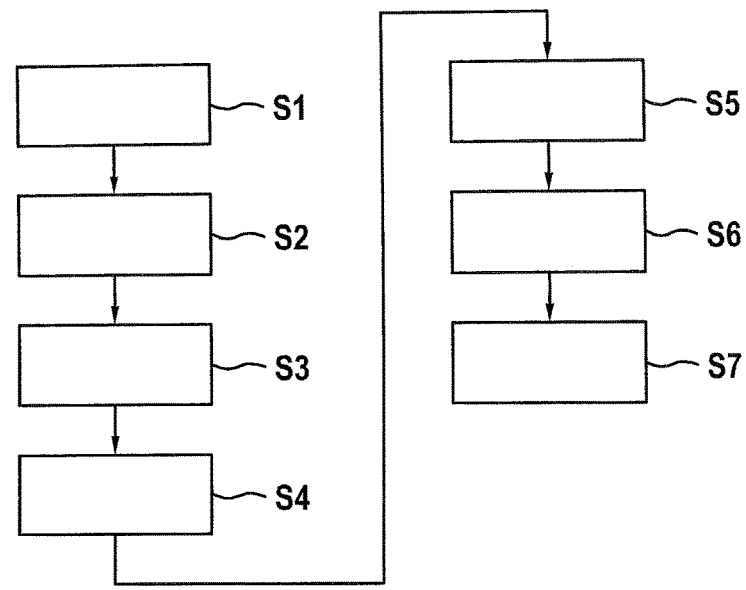
FIG. 3 shows a flow chart of one method of a specific embodiment according to the present invention.

FIG. 3 shows a flow chart of one specific embodiment of a method according to the present invention.

The method provides for receiving a reference signal 4 in a first step S1. In a second step S2, a measuring signal 6 is received, which denotes a recorded response by micromechanical actuator 2 to control signal 7.

The actual signal processing takes place after receiving reference signal 4 and measuring signal 6. In a third step S3, filtering and/or attenuating of predefined frequency modes and/or predefined frequency components in reference signal 4 is/are provided.

In a fourth step S4, received measuring signal 6 is modified by minimizing the quality of the first mode of the micromechanical actuator by processing received measuring signal 6 in the closed loop circuit. In particular, in one specific embodiment, for example, the complex poles of the first mode or further modes of the micromechanical actuator may also be shifted in the pole-zero plot of the micromechanical actuator in the direction of the real axis of the pole-zero plot by processing received measuring signal 6. In addition or alternatively, by processing received measuring signal 6, the first mode of the micromechanical actuator may be entirely attenuated and/or eliminated and, furthermore, an additional pole with a predefined attenuation factor may be situated in the pole-zero plot of the micromechanical actuator in the closed loop circuit.

Fifth step S5 provides for minimizing of the deviation between filtered and/or attenuated reference signal 12 and received measuring signal 6 and outputting a minimized reference signal 14.

In a sixth step S6, the phase of the difference between the minimized reference signal 14 and the modified measuring signal 13 is rotated for at least one predefined frequency. In particular, in one specific embodiment, for example, during rotation S6 of the phase, the phase may be rotated from −180° through −360° to 0° through −180°.

Finally, in step S7, the difference between minimized reference signal 14 and modified measuring signal 13 with the rotated phase are transmitted as control signal 7 to micromechanical actuator 2.

Figure 4:
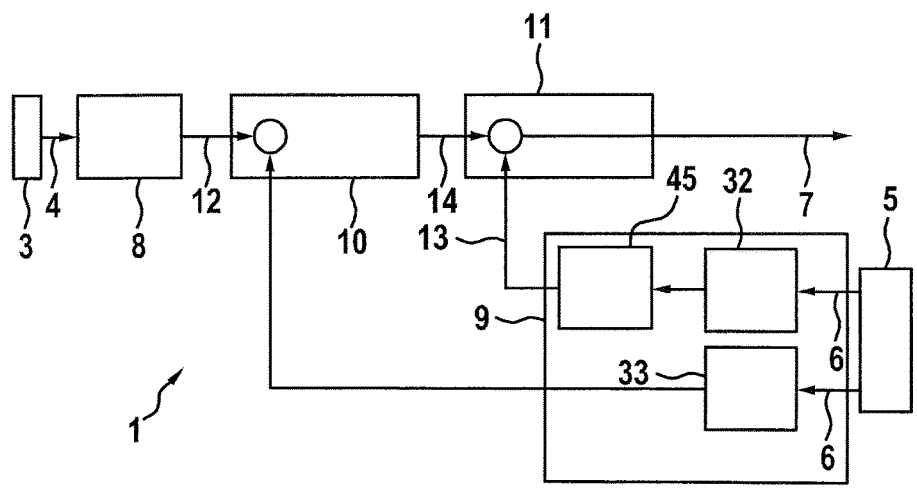
FIG. 4 shows a block diagram of one further specific embodiment of a controller.

FIG. 4 shows a block diagram of another specific embodiment of controller 1 according to the present invention.

Controller 1 in FIG. 4 is based on controller 1 in FIG. 1 and differs from that controller in that second controller element 9 includes two filters 32, 33, the first filter being situated in front of attenuation element 45 of second controller element 9 and second filter 33 filtering measuring signal 6 which is transmitted to third controller element 10.

Filters 32, 33 may, for example, be configured as analog or digital filter elements, for example, PT1, PT2, FIR, IIR, or notch filter elements.

Figure 5:
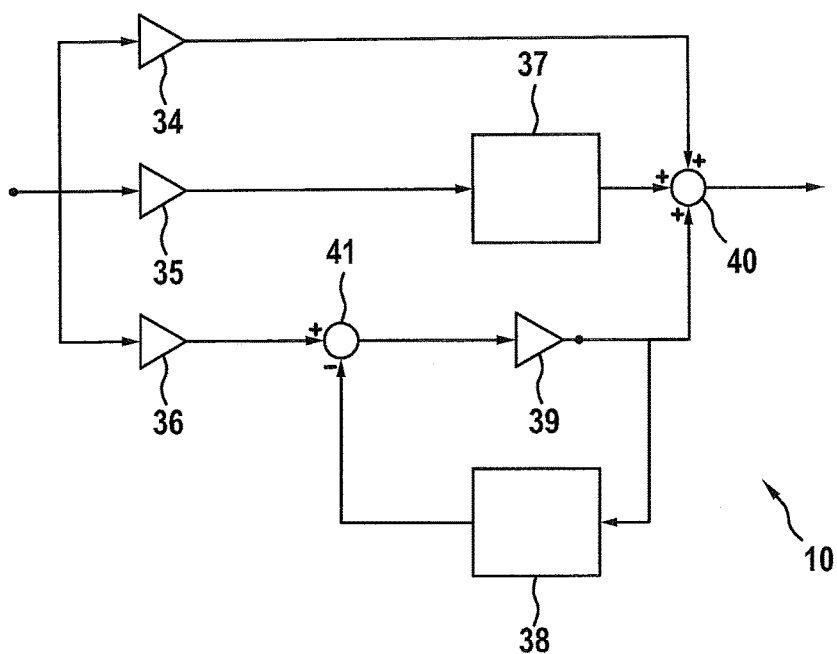
FIG. 5 shows a block diagram of one specific embodiment of a third controller element according to the present invention.

FIG. 5 shows a block diagram of one specific embodiment of third controller element 10 according to the present invention.

Third controller element 10 in FIG. 5 is configured as a PID controller and has three branches, the outputs of which are added in block 40, the result of the sum being the output of PID controller 10.

The output of PID controller 10 is supplied in the first branch to a proportional element 34. In the second branch, the input signal is supplied to a proportional element 35 and to an integrator 37.

The third branch includes proportional element 36 in front of a loop. The loop includes a difference block 41 which establishes the difference between the output of proportional element 36 and the returned variable of the loop and supplies it to an additional proportional element 39 which represents a filter coefficient.

In the return of the loop, a filter 38 is situated which exhibits an integrating function.

FIG. 6 shows a Bode plot of a micro-mirror 25.

The Bode plot shows two individual diagrams which are positioned one upon the other. On the x-axis of the diagrams, the frequency is in each case plotted logarithmically. On the y-axis of the upper diagram, the attenuation in dB of micro-mirror 25 is plotted at the respective frequency. On the y-axis of the lower diagram, the phase of the output signal of micro-mirror 25 is in each case shown at the respective frequency.

In the upper diagram, the curve begins at approximately −5 dB and exhibits a local maximum at a frequency of 741 Hz or a first resonance mode with an absolute value of approximately 8.19 dB. From 741 Hz until shortly before 2.1 KHz the attenuation drops to approximately −30 dB, then drops at approximately 2.1 KHz to −83.8 dB (first anti-resonance mode) and rises to 20.5 dB until 2.4 KHz (second resonance mode.) The attenuation drops between 2.4 KHz and 2.6 KHz to approximately −3 dB, and rises at 2.6 KHz to 21.9 dB (third resonance mode) and drops until 2.87 KHz again to −56.3 dB (second anti-resonance mode.) Immediately after 2.87 KHz, the attenuation rises to approximately 30 dB, and then drops to approximately 10.9 KHz again to approximately −56 dB (third anti-resonance mode), rises immediately to approximately −53 dB and continues in an approximately parabolic arc until 28 KHz and −35.8 dB (fifth resonance mode) to then drop to −128 dB until 49.2 KHz. From there, the signal rises to approximately −100 dB and then drops until the end of the diagram at 1 MHz to −140 dB.

In the lower diagram, the phase proceeds at 0° until approximately 400 Hz, then drops to −90° until 741 Hz and drops to −180° until approximately 1 KHz. At 2.1 KHz the phase rises to 0° and at 2.4 KHz the phase drops to −180°, to drop at 2.6 KHz to −360° and rise again at 2.87 KHz until −180°. At approximately 10.9 KHz the phase response spikes to approximately −100°, then proceeds at −180° until 28 KHz and drops between 28 KHz and 49.2 KHz to −360°, to proceed at −180° until the end of the diagram.

The diagram of FIG. 6 shows clearly the phase shift from −180° to −360°, which a micro-mirror 25 exhibits, when in the Bode plot of micro-mirror 25 two modes are followed by an anti-resonance mode.

Figure 7:
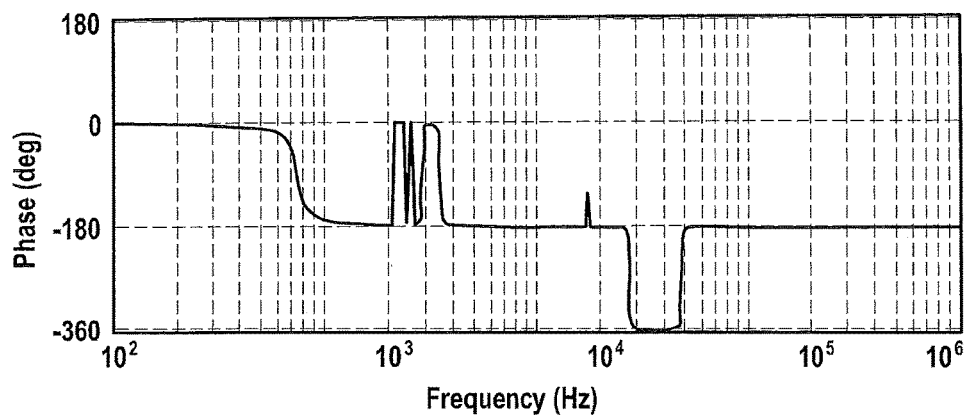
FIG. 7 shows a modified frequency response for the micro-mirror in FIG. 6.

FIG. 7 shows a changed phase response for the micro-mirror in FIG. 6 as it is created by fourth controller element 11.

In FIG. 7 the lower diagram of FIG. 6 is shown again, after the phase response was modified by fourth controller element 11.

It is clearly apparent that the phase, which in FIG. 6 was between 2.6 KHz and 2.87 KHz at −360°, is now between 0° and −180°.

Figure 8:
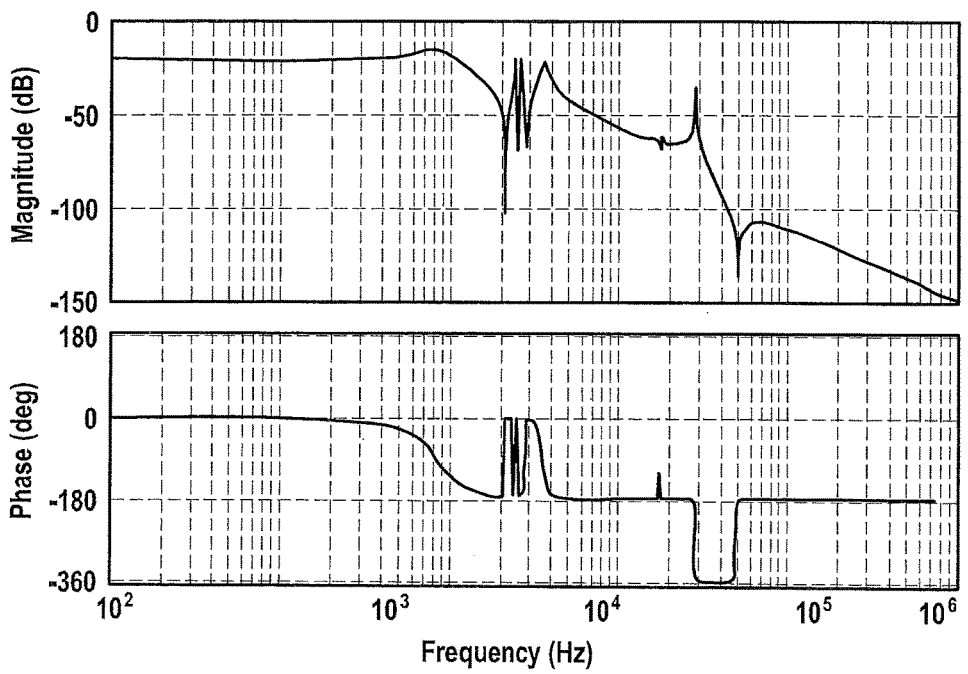
FIG. 8 shows a modified Bode plot for the micro-mirror in FIG. 6.
Figure 9:
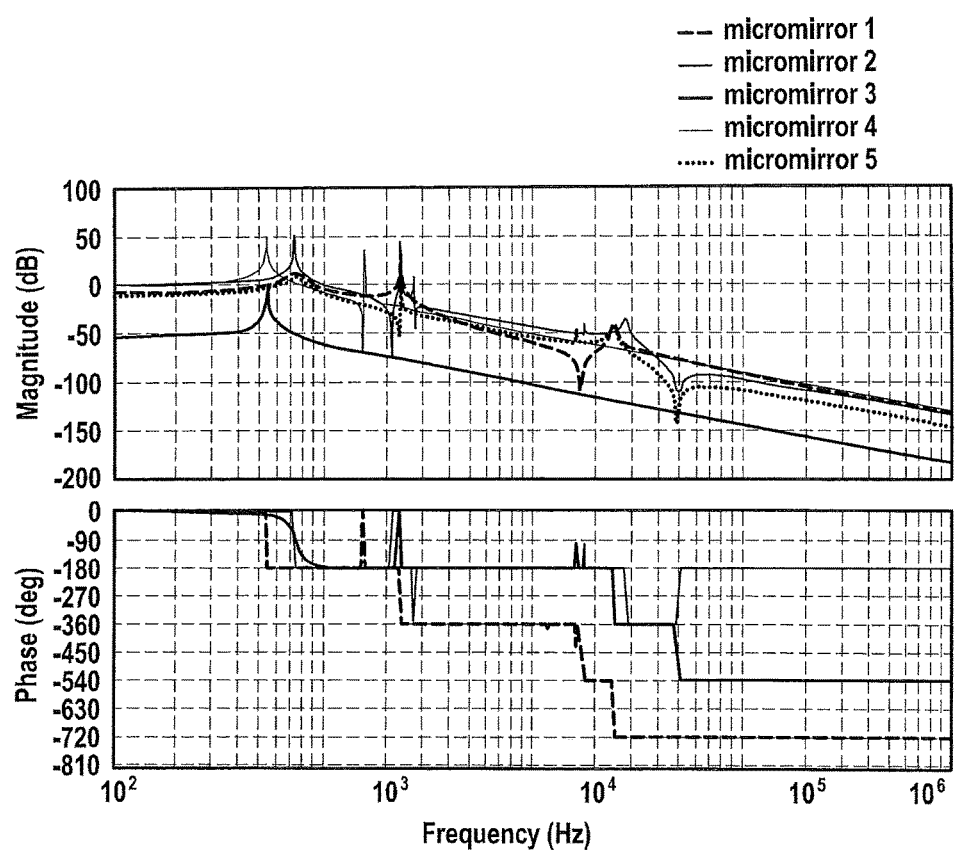
FIG. 9 shows a Bode plot for different MEMS mirrors.
Figure 10:
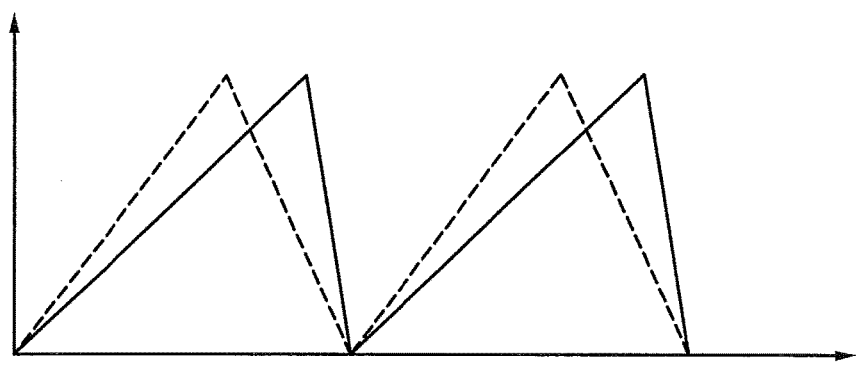
FIG. 10 shows possible sawtooth signals for the actuation of a MEMS mirror in the time range.
Figure 11:
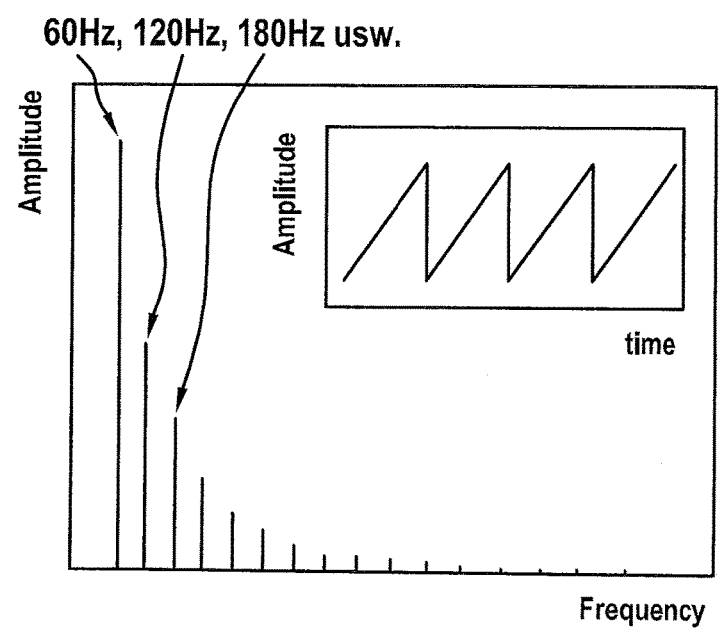
FIG. 11 shows one possible sawtooth signal for the actuation of a MEMS mirror in the frequency range.

FIG. 8 shows a changed Bode plot for the micro-mirror in FIG. 6 in the closed loop circuit as it is created by the second and the fourth controller element in the closed loop-circuit.

It is clearly apparent in the Bode plot of FIG. 8 that the first resonance mode was eliminated at 741 Hz and that now all modes exhibit a value of under 0 dB.

What is claimed is:

1. A controller for actuating a micromechanical actuator, comprising:
at least one of: an application specific integrated circuit (ASIC), or a processor configured to execute program instructions stored on a non-transitory machine-readable medium;
wherein the at least one of the ASIC or the processor executing the program instructions is configured to implement:
a first signal input to receive a reference signal representing a desired position of the micromechanical actuator;
a second signal input to receive a measuring signal which denotes a recorded position of the micromechanical actuator in response to a control signal;
a first linear controller element to filter and/or attenuate the received reference signal by filtering and/or attenuating predefined frequency modes in the received reference signal and to output the filtered and/or attenuated reference signal;
a second linear controller element to modify the received measuring signal by minimizing the quality of the first mode of the micromechanical actuator in the received measuring signal by processing the received measuring signal in the closed loop circuit, and to output the modified measuring signal;
a third linear controller element to minimize the deviation between the filtered and/or the attenuated reference signal and the received measuring signal and to output a minimized reference signal based on the minimizing; and
a fourth linear controller element to rotate the phase of the difference between the minimized reference signal and the modified measuring signal for at least one predefined frequency and to transmit the difference between the minimized reference signal and the modified measuring signal with the rotated phase as the control signal to the micromechanical actuator;
wherein the first linear controller element, the second linear controller element, the third linear controller element, and the fourth linear controller element implement only linear functions.

2. The device of claim 1, wherein the fourth controller element is configured to rotate the phase from −180° through −360° to 0° through −180°.

3. The controller of claim 1, wherein the second controller element is configured to shift, during modification, the complex poles of the micromechanical actuator of the first mode and/or further modes of the micromechanical actuator in the pole-zero plot of the micromechanical actuator in the direction of the real axis of the pole-zero plot by processing received measuring signal.

4. The device of claim 1, wherein the second controller element is configured to entirely eliminate the first mode of the micromechanical actuator during modification by processing the received measuring signal and to situate an additional pole with a predefined attenuation factor in the pole-zero plot of the micromechanical actuator by processing the received measuring signal in the closed loop circuit.

5. The device of claim 1, wherein the third controller element includes a PID controller element.

6. The device of claim 1, wherein the first controller element includes a digital filter element.

7. The device of claim 1, wherein the first controller element includes a digital filter element, which includes at least one of an IIR filter element, a notch filter element, and an FIR filter element.

8. A controller for actuating a micromechanical actuator, comprising a control system, the control system including at least one of: an application specific integrated circuit (ASIC), or a processor configured to execute program instructions stored on a non-transitory machine-readable medium;
  wherein the at least one of the ASIC or the processor executing the program instructions is configured to implement:
    a first signal generator to output a reference signal representing a desired position of the micromechanical actuator;
    a controller arrangement to receive the reference signal and to output a control signal for the micromechanical actuator;
    a first signal processing unit to process the control signal and to transmit it to the micromechanical actuator; and
    a second signal processing unit to record a position of the micromechanical actuator in response to the control signal and to transmit a measuring signal to the controller, which denotes the recorded position;
  wherein the controller arrangement includes:
    a first signal input to receive the reference signal;
    a second signal input to receive the measuring signal;
    a first linear controller element to filter and/or attenuate the received reference signal by filtering and/or attenuating predefined frequency modes in the received reference signal and to output the filtered and/or attenuated reference signal;
    a second linear controller element to modify the received measuring signal by minimizing the quality of the first mode of the micromechanical actuator in the received measuring signal by processing the received measuring signal in the closed loop circuit, and to output the modified measuring signal;
    a third linear controller element to minimize the deviation between the filtered and/or the attenuated reference signal and the received measuring signal and to output a minimized reference signal based on the minimizing; and
    a fourth linear controller element to rotate the phase of the difference between the minimized reference signal and the modified measuring signal for at least one predefined frequency and to transmit the difference between the minimized reference signal and the modified measuring signal with the rotated phase as the control signal to the micromechanical actuator;
  wherein the first linear controller element, the second linear controller element, the third linear controller element, and the fourth linear controller element implement only linear functions.

9. A micro-mirror system, comprising:
  at least one micro-mirror; and
  at least one actuating system to actuate the micro-mirror;
  wherein the at least one actuating system includes at least one of: an application specific integrated circuit (ASIC), or a processor configured to execute program instructions stored on a non-transitory machine-readable medium;
  wherein the at least one of the ASIC or the processor executing the program instructions is configured to implement:
    a first signal generator to output a reference signal representing a desired position of a micromechanical actuator;
    a controller arrangement to receive the reference signal and to output a control signal for the micromechanical actuator;
    a first signal processing unit to process the control signal and to transmit it to the micromechanical actuator; and
    a second signal processing unit to record a position of the micromechanical actuator in response to the control signal and to transmit a measuring signal to the controller, which denotes the recorded position;
  wherein the controller arrangement includes:
    a first signal input to receive the reference signal;
    a second signal input to receive the measuring signal;
    a first linear controller element to filter and/or attenuate the received reference signal by filtering and/or attenuating predefined frequency modes in the received reference signal and to output the filtered and/or attenuated reference signal;
    a second linear controller element to modify the received measuring signal by minimizing the quality of the first mode of the micromechanical actuator in the received measuring signal by processing the received measuring signal in the closed loop circuit, and to output the modified measuring signal;
    a third linear controller element to minimize the deviation between the filtered and/or the attenuated reference signal and the received measuring signal and to output a minimized reference signal based on the minimizing; and
    a fourth linear controller element to rotate the phase of the difference between the minimized reference signal and the modified measuring signal for at least one predefined frequency and to transmit the difference between the minimized reference signal and the modified measuring signal with the rotated phase as the control signal to the micromechanical actuator;
  wherein the first linear controller element, the second linear controller element, the third linear controller element, and the fourth linear controller element implement only linear functions.

10. A method for actuating a micromechanical actuator, the method performed using at least one of: an application specific integrated circuit (ASIC), or a processor configured to execute program instructions stored on a non-transitory machine-readable medium; the method comprising:
  receiving, by the at least one of the ASIC or the processor, a reference signal representing a desired position of a micromechanical actuator;

receiving, by the at least one of the ASIC or the processor, a measuring signal which denotes a recorded position of the micromechanical actuator in response to a control signal;

filtering and/or attenuating, by a first linear controller element implemented by the at least one of the ASIC or the processor executing the program instructions, the received reference signal by filtering and/or attenuating predefined frequency modes in the reference signal;

modifying, by a second linear controller element implemented by the at least one of the ASIC or the processor executing the program instructions, the received measuring signal by minimizing the quality of the first mode in the received measuring signal by processing the received measuring signal in the closed loop circuit;

minimizing, by a third linear controller element implemented by the at least one of the ASIC or the processor executing the program instructions, the deviation between the filtered and/or attenuated reference signal and the modified measuring signal, and outputting, by the third linear control element, a minimized reference signal based on the minimizing;

rotating, by a fourth linear controller element implemented by the at least one of the ASIC or the processor executing the program instructions, the phase of the difference between the minimized reference signal and the modified measuring signal for at least one predefined frequency; and transmitting, by the at least one of the ASIC or the processor, the difference between the minimized reference signal and the modified measuring signal with the rotated phase as the control signal to the micromechanical actuator;

wherein the first linear controller element, the second linear controller element, the third linear controller element, and the fourth linear controller element implement only linear functions.

11. The method of claim 10, wherein during rotation of the phase, the phase is rotated from $-180°$ through $-360°$ to $0°$ through $-180°$.

12. The method of claim 10, wherein during modification of the received measuring signal, at least one of the following is satisfied:
(i) the complex poles of the first mode and/or further modes of the micromechanical actuator in the closed loop circuit are shifted in the direction of the real axis of the pole-zero plot of the closed loop circuit by processing the received measuring signal in the pole-zero plot of the micromechanical actuator; and
(ii) the first mode and/or further modes of the micromechanical actuator are entirely attenuated and/or eliminated by processing the received measuring signal, and an additional pole with a predefined attenuation factor is situated in the pole-zero plot of the closed-loop circuit by processing the received measuring signal.

* * * * *